United States Patent [19]

Kappelt, Jr.

[11] Patent Number: 4,619,368
[45] Date of Patent: Oct. 28, 1986

[54] PC BOARD RACK

[75] Inventor: Charles E. Kappelt, Jr., Linesville, Pa.

[73] Assignee: Molded Fiber Glass Company, Linesville, Pa.

[21] Appl. No.: 758,890

[22] Filed: Jul. 25, 1985

[51] Int. Cl.$^4$ .............................................. A47F 7/00
[52] U.S. Cl. ...................................... 211/41; 206/449
[58] Field of Search ............... 211/41, 43, 184, 40; 312/9, 10, 12; 206/387, 454, 455, 456, 449, 328, 332, 561

[56] References Cited

U.S. PATENT DOCUMENTS

| | | | |
|---|---|---|---|
| 3,666,337 | 5/1972 | Sztorc | 206/387 X |
| 4,317,603 | 3/1982 | Pepicelli et al. | 206/387 X |
| 4,418,820 | 12/1983 | Nagle et al. | 211/41 X |
| 4,427,114 | 1/1984 | Howell et al. | 206/454 X |
| 4,432,453 | 2/1984 | Berkman | 206/387 |

FOREIGN PATENT DOCUMENTS 1406259  9/1975  United Kingdom .................. 211/41

Primary Examiner—Robert W. Gibson, Jr.
Attorney, Agent, or Firm—Dale R. Lovercheck; Charles L. Lovercheck; Wayne L. Lovercheck

[57] ABSTRACT

A rack for printed circuit boards is disclosed. The rack has a first wall with a circuit board engaging surface and a second wall with a circuit board engaging surface disposed generally perpendicular to one another. The two surfaces are rigidly fixed together at right angles to each other and the board engaging surfaces are fixed to and supported by a first lateral flange and a second lateral flange. The first board engaging surface has ribs at the side edges for engaging the edges of boards and a recess is formed between the two board engaging surfaces which receives projections on the boards, debris, liquids or other foreign material. For manual handling and quick access to boards, the rack can be used alone on a desk top or the like wherein bottom board edges rest at an acute angle to the desk surface. For mechanical handling and shipment of boards, the rack can be used in opposed pairs adjustably connected and within a container wherein bottom board edges rest parallel to support surface. For manual or mechanical handling of high quantities of equal length boards, the rack can be used in opposed pairs fixedly connected by side panels with or without a bottom panel and with or without a lid wherein bottom board edges rest parallel to the support surface.

27 Claims, 11 Drawing Figures

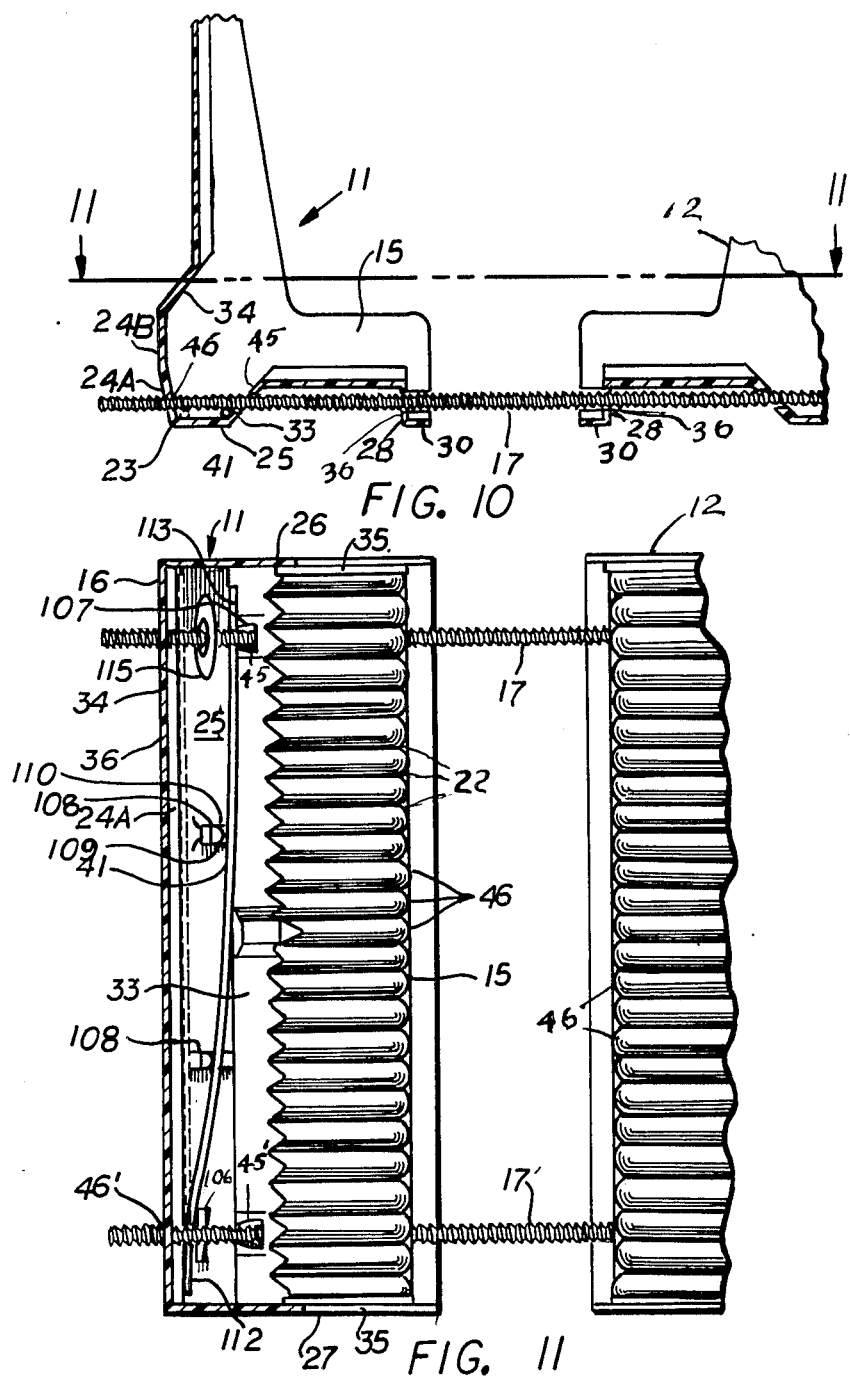

PC BOARD RACK

BACKGROUND OF INVENTION

The present invention relates to carriers for boards and, more particularly to a novel and improved rack for removably supporting a plurality of printed circuit boards on edge in parallel relation.

DESCRIPTION OF THE PRIOR ART

Printed circuit cards or boards sometimes referred to as PC boards have become important components in the electronic industry. These boards are generally rectangular, plate like in configuration and may have electronic components attached to them that may be thicker than the boards and may have appendages that extend beyond the edges of the boards. The sizes of these boards vary within substantial limits.

Thus, the board holding unit or rack for supporting such boards in production, transportation and storage should be quite versatile to suit the size requirements, the degree of protection required, and the handling or storage requirements.

Generally, these racks heretofore suggested were relatively costly particularly as to initial manufacturing and assembly cost. The cost of the racks tends to restrict the use of such racks to applications which require a small number of racks. Where a substantial number of racks are needed, the problem of cost of manufacture and assembly of the racks becomes very significant.

Generally, the racks or supports which are presently available are designed to slideably receive the printed circuit cards or boards side by side in spaced-parallel relation. These racks are relatively expensive to manufacture and assemble. Guide slots, guide rails or the like have been devised to facilitate insertion of cards into such racks; however, such board-guiding means are complex, expensive and inefficient to use.

REFERENCE TO PRIOR ART

Applicant is aware of prior art U.S. Pat. Nos. 3,627,140; 3,877,134; 3,915,307; 3,798,423; and 2,624,466. None of these Patents show or teach the features of the invention referred to above or disclosed herein. The PC board rack disclosed herein is an improvement over the PC board rack shown in U.S. Pat. No. 3,627,140.

SUMMARY OF INVENTION

The printed circuit board rack disclosed herein has the following important features:

Each rack unit has two grooved walls integrally connected together at right angles to each other. One side edge of a PC board can rest in a groove in one of the walls and its end edge can be received in a groove in the other wall. Either one or the other of the grooved walls of the unit can be supported horizontally and the other can be supported vertically. One of the walls of the unit is about twice as long as the other and has a leg at the front that is approximately twice as long as the leg at the distal end of the other wall so that in a first configuration the rack unit is used as a stand alone unit, and the long leg will hold the long support wall at about a 10° angle to the supporting surface of the table, bench or floor that is used as a support.

The short wall has a supporting leg that is shorter than the long leg supporting the long supporting wall so that when the units are used in opposed pairs the grooved surface of the short supporting wall will be supported generally parallel to the supporting surface.

In a second configuration two rack units can be supported in opposed pairs held in spaced relation to each other by threaded rods. In a third configuration the opposed pairs of racks can be stacked one pair on top of another. In a fourth configuration the opposed tandem pairs can be placed in containers.

OBJECTS OF THE INVENTION

Accordingly, it is an object of the present invention to provide a novel and improved rack unit for supporting a plurality of printed circuit cards or boards.

Another object of the present invention is to provide a printed circuit card rack which can be used in opposed paired relation with a similar rack unit.

Another object of the invention is to provide a card rack unit that can be used in opposed paired relation with a similar card rack unit and the two rack units held in fixed spaced relation to each other by spacers which may be in the form of threaded rods with suitable fastening means.

Another object of the invention is to provide a stand alone rack unit for PC boards which may have protrusions at their corners.

Another object is to provide rack units which can be used in opposed pairs held together by suitable rods or side panel units or the pairs can be stacked and/or then placed into a container.

Another object of the invention is to provide a novel and improved configuration of rack unit.

Another object is to provide a rack unit with recessed area to provide an escape trough for liquids which may be used with PC boards in process, for debris which may otherwise obstruct the seating of boards into grooves, and a clearance space for protrusions on the ends of boards.

Another object of the invention is to provide an improved rack usable in opposed paired relation and adjustable to fit a plurality of sizes of PC boards.

Another object of the invention is to provide a configuration of rack unit which allows for the use of simple hardware for adjusting the relative position of the rack units in opposed paired position. Specifically a pair of rack units that have holes through which two pieces of threaded metal rod may pass. A single piece of spring wire at each rack may hold the racks in position or an additional pawl means may engage the threaded rods providing a ratchet which allows free adjustment in the rack units in one direction and prevents slipping from adjustment in the other direction. Adjustability in either direction may be accomplished after unseating the spring from its pedestals. As an alternate fastening means, a washer larger than the threaded rod can be held at an angle to the rod to bind and hold the rod.

Another object is to provide rack unit assemblies which may be easily fitted into existing secondary (shipping or storage) containers.

With the above and other objects in view, the present invention consists of the combination and arrangement of parts hereinafter more fully described, illustrated in the accompanying drawing and more particularly pointed out in the appended claims, it being understood that changes may be made in the form, size, proportions and minor details of construction without departing from the spirit or sacrificing any of the advantages of the invention.

GENERAL DESCRIPTION OF DRAWINGS

FIG. 10 is a partial cross sectional view similar to FIG. 8 of two rack units in paired adjustable relation.

FIG. 11 is a partial cross sectional top view taken on line 11—11 of FIG. 10.

DETAILED DESCRIPTION OF THE DRAWINGS

Figures 1, 2:
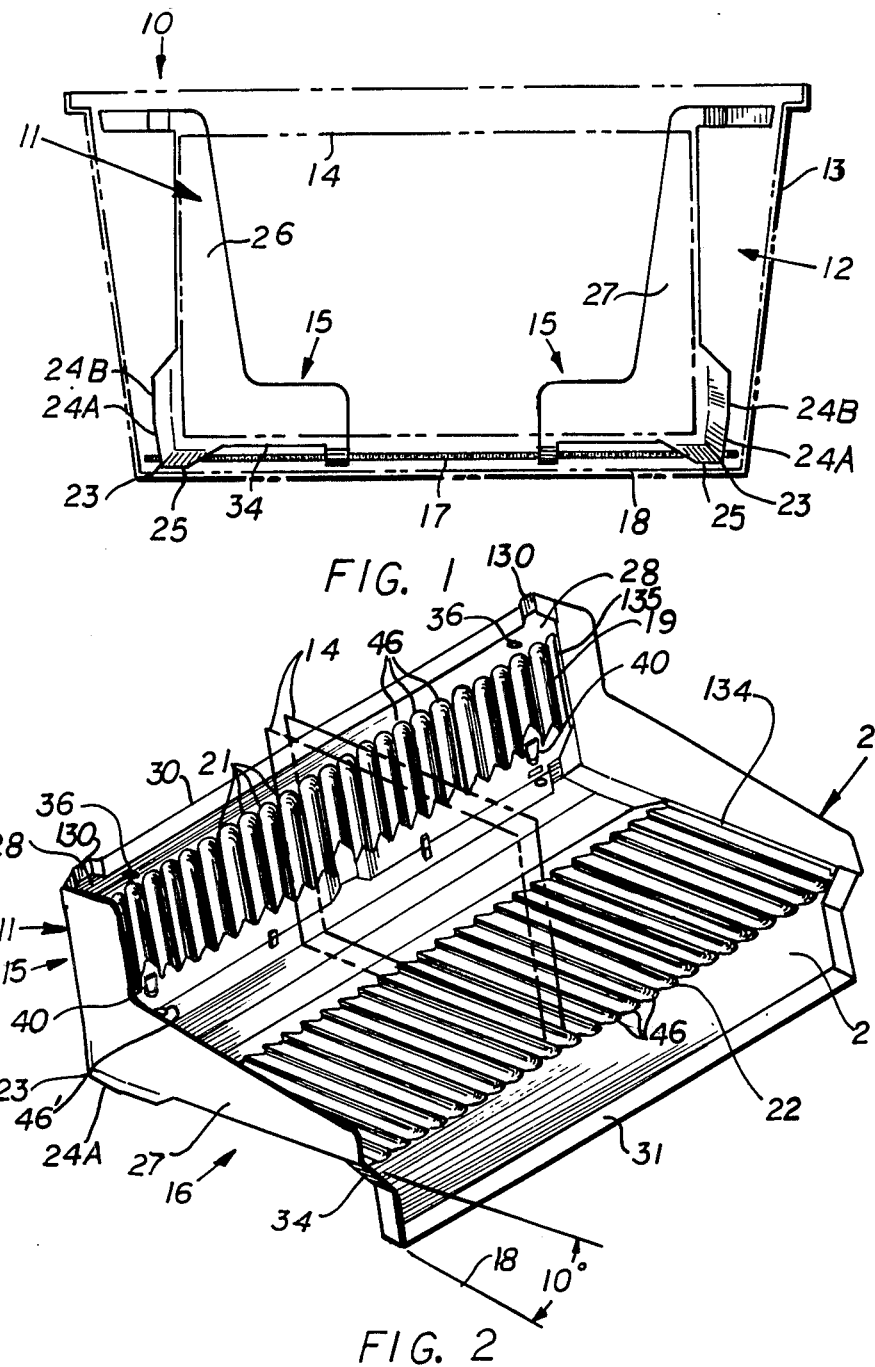
FIG. 1 is a diagramatic side view of rack units shown in paired adjustable position in a container.
FIG. 2 is an isometric view of a rack unit in stand alone position, according to the invention, holding two PC boards, shown in phantom.
Figure 3:
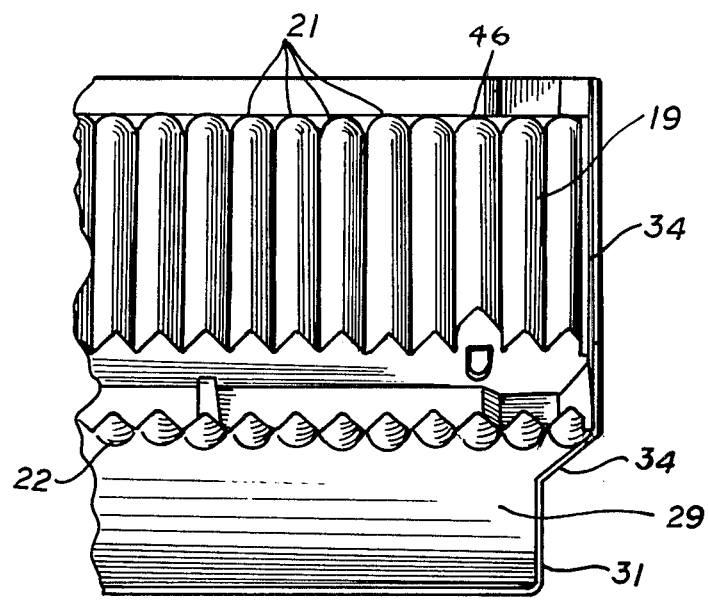
FIG. 3 is an partial side view of a rack of a unit.
Figure 4:
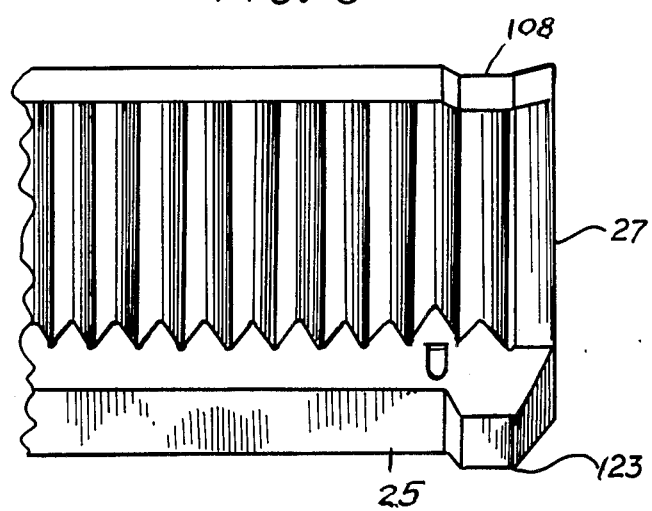
FIG. 4 is an isometric view of two rack units stacked.
Figure 5:
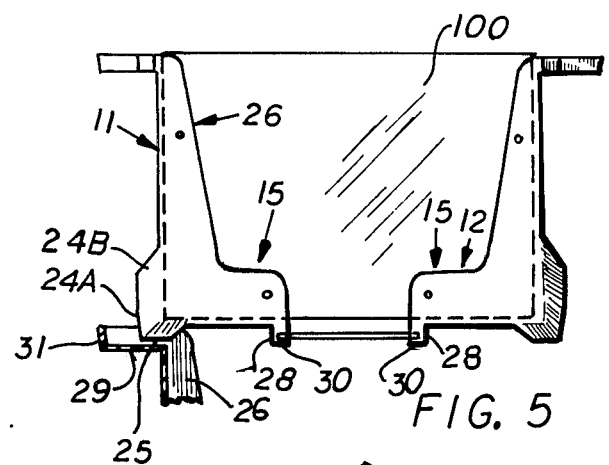
FIG. 5 is a partial side view of two rack units stacked.
Figure 6:
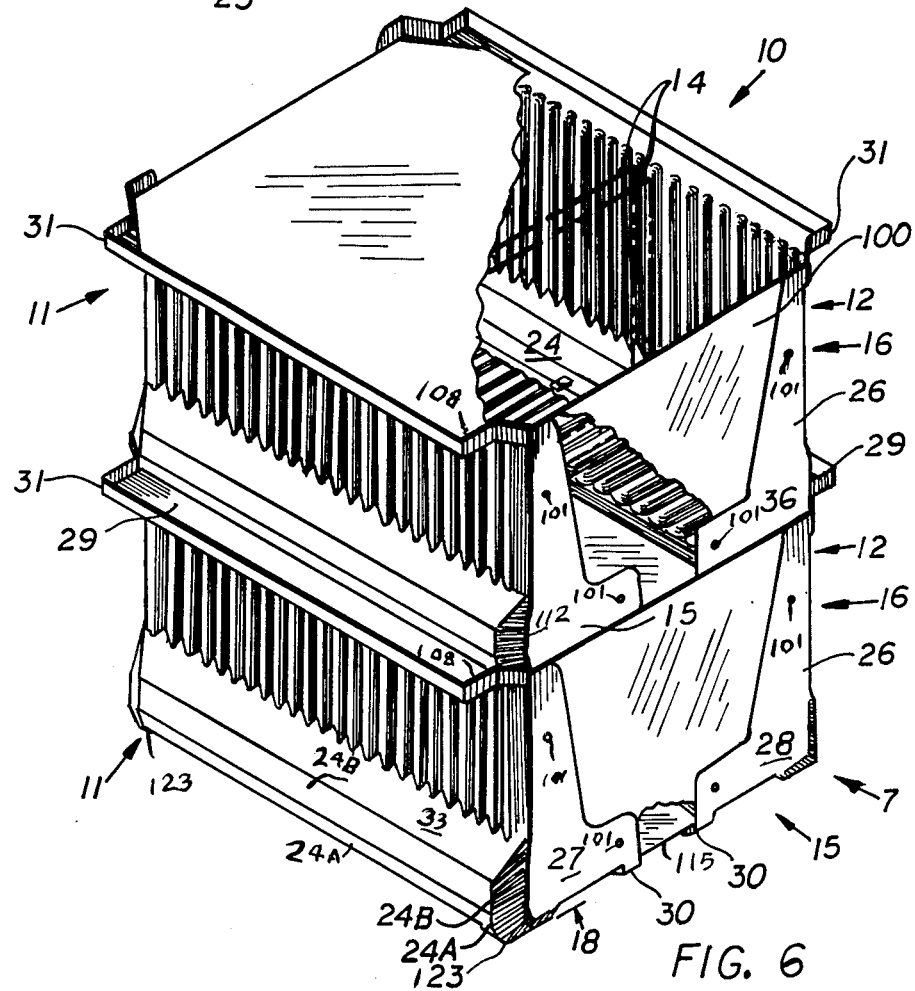
FIG. 6 is an isometric view of two rack units according to the invention in paired position, stacked.
Figure 7:
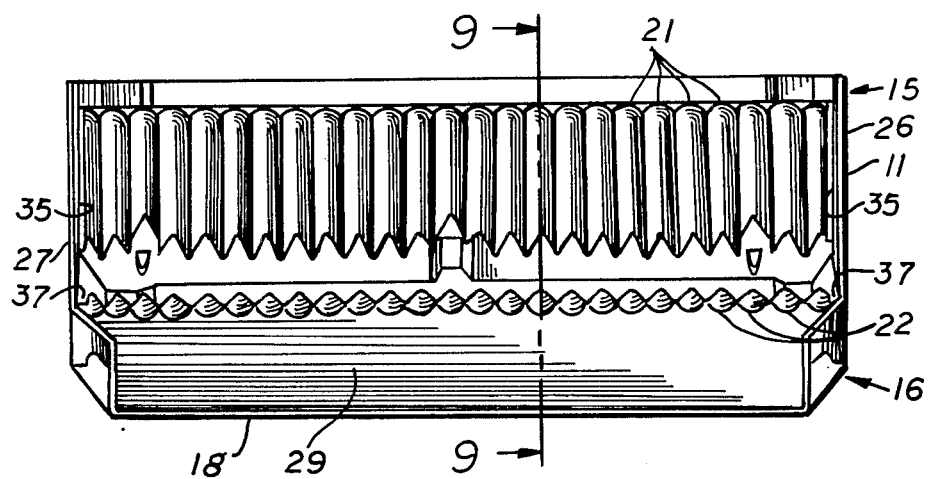
FIG. 7 is an enlarged top view of a rack unit.
Figure 8:
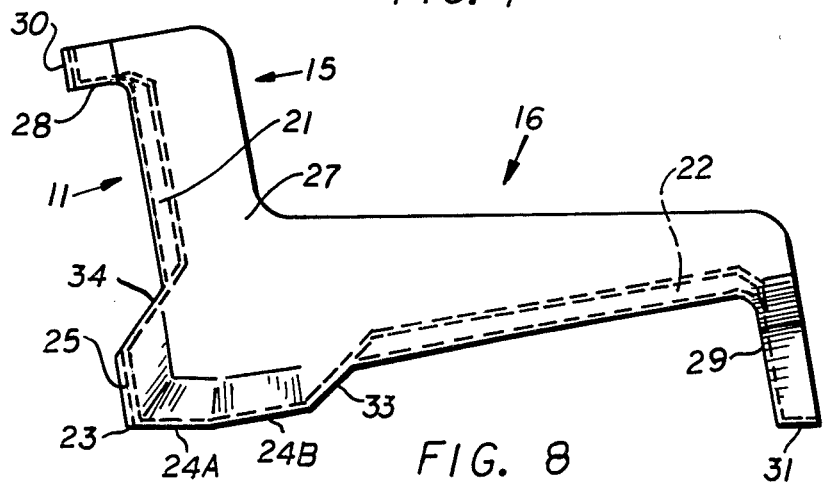
FIG. 8 is a side view of a rack unit.
Figure 9:
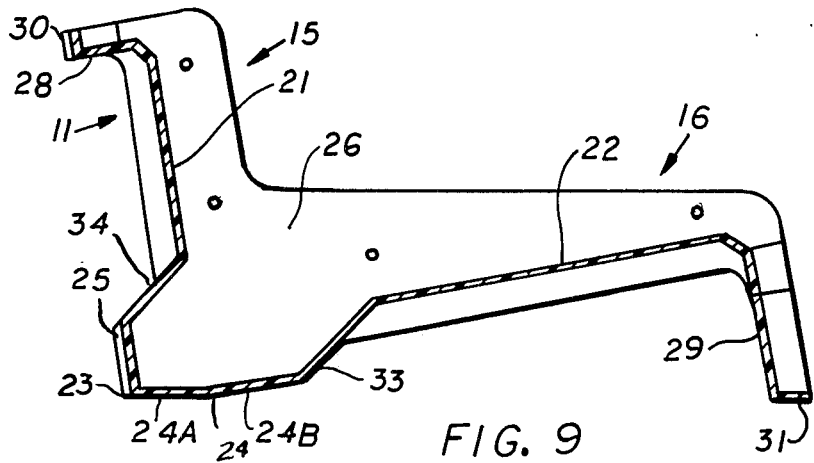
FIG. 9 is a longitudinal cross sectional side view of a rack unit.

Now, with more particular reference to the drawings in FIG. 1, I show in combination 10, a rack unit 11 for supporting PC boards 14. The rack unit comprises a first short supporting wall 15 and a second long supporting wall 16 disposed generally at right angles to each other. The walls 15 and 16 are integrally connected together in L-shaped relation by bottom parts 24A, 24B and 25 and that define the bottom of the recess and side members 26 and 27. Laterally spaced longitudinally extending generally parallel V-shaped first grooves 21 are formed in the short wall 15 on the side adjacent said long wall 16 and laterally spaced longitudinally extending generally parallel V-shaped second grooves 22 are provided in said long wall on the side thereof adjacent said short wall. An end and a side of each PC board each rests in one of these grooves 21 and 22.

A short plate like leg 28 is connected to said short wall 15 at the distal end thereof remote from said long wall 16 and a foot 30 is connected to the short leg 28 at right angle to it.

A long plate like leg 29 is integrally connected to said long wall 16 at the distal end thereof remote from said short wall and the leg 29 extends generally parallel to said short wall 15. A second plate like foot means 31 is attached to said long leg 29 at the distal end of said long leg 29 opposite the short wall. The outer end of each short foot extends downward at 130 adjacent its outer ends to provide a space to receive an upward bow of a support surface. The ends 130 extend downward below the intermediate part 25 providing a foot at each end.

The rack unit 11 is adapted to stand alone supported on a flat surface 18 such as a desk top, table top or bench with foot 31 and bottom 24A resting on the flat surface 18. In this position the long leg 29 supports the long wall 16 at an acute angle of about 10 degrees to the supporting surface.

FIGS. 1, 3, 4, 5, 6, 10 and 11 show how two rack units 11 and 12 can be supported in paired relation to support PC boards on short walls 15 and between long walls 16. The rack units may be held together by any suitable means, for example, threaded rods 17 and the rods may be held by wire springs 41 which provide an adjustable connection of the position of the first rack unit 11 to the second rack unit 12. The opposed pair of rack units 11 and 12 each are designed to be supported on a supporting surface 18 which may be a container bottom, a table, a desk, a work bench or the like. The foot 130 and the outer end 123 of bottom member 25 of each rack unit may rest on surface 18 so that the short walls 15 are horizontal and long walls 16 are vertical and walls 16 are disposed generally at right angles to the supporting surface 18 and bottom member 24B and feet 28.

The sides of the grooves 21 are connected to each other by a small radius and the sides of grooves 22 are connected to each other by a small radius. The front end of the sides defining the grooves 21 and 22 meet at a rounded end surface 46 along the short leg 28. Each rack unit 11 and 12 has L-shaped side wall flanges 26 and 27 integrally attached to the first wall and the second wall forming sides for said PC board grooved support surfaces and reinforcement holding legs 15 and 16 in position. Narrow grooves 134 and 135 in walls 11 and 12 adjacent side 26 and 27 receive the ends and edges of side panels when the side walls are in the position shown in FIGS. 5 and 6 thereby providing sides on the container.

The side walls formed by side members 26 and 27 serve as gussets for holding the grooved walls 15 and 16 rigidly at 90° to each other. The side members 26 and 27 also serve as surfaces to which side panels 100 may be attached by suitable bolts 101 or other fastening means thus forming sides for an open topped rack to protect the PC boards. The recess at apex 23 is made up of first bottom part 24A integrally connected to second bottom parts 24B which is attached to support wall 15 by bottom member 34. Bottom member 24A is attached to bottom member 25 at apex 23 and to wall 16 by bottom part 33. The bottom members 24 and 25 are disposed in planes below the lower crests of grooved walls 15 and 16 and integrally connecting to the bottoms by inclined walls 33 and 34. The recess is intended to receive and divert foreign matter such as liquids and pieces of foreign matter which may have been applied to the printed circuit boards. The recess also provides a space for protrusions which may occur at the corners of some of the boards. The recess also provides a space for threaded rods 17 to extend. These threaded rods 17 may include the adjusting spring wire 41, for holding the threaded rods.

Referring to FIGS. 2, 10 and 11, the bottom 25 have ramp 106 integrally attached to it. Ramp 106 is located on bottom 25 below hole 46' in wall 24A so that ramp 106 underlies the threaded rod 17' as it passes through hole 46' and through hole 45' in rack units 11 and 12. The ramp unit 106 has an vertical side adjacent side 24B and an inclined shoulder on the opposite side. Wire 41 is straight in its unstressed condition but is bowed in position when put behind the shoulders 110 on ramp 108 and under rod 17 against inclined side 45 under rod 17. Thus, the resilient stress on end 112 of wire 41 will cause it to tend to move up the inclined ramp 106. The same stress will cause the end 113 to move up inclined side 33 into engagement with the underside of threaded rod 17. Likewise, end 112 of threaded rod 17' will be urged to climb up ramp 106. Any force on unit 11 tending to move it away from the unit 12 will cause the threaded rods 17 and 17' to move the ends 112 and 113 of the wire to move up the ramps toward the rods 17 and 17' into tighter engagement with them, resisting any movement of the unit 11 away from the unit 12. Likewise, a force on rack unit 11 toward unit 12 will move the wire ends 112 and 113 down their inclined surfaces of ramp 106 and side 33 so that the rods 17 and 17' will slide over the wires 41 allowing the rack units to move toward each other, providing a rachet allowing the wire 41 to slide under the threaded rods 17 and 17' when the rack units 11 and 12 are forced toward each other but causing them to resist movement away from one another unless the wire 41 is lifted over the ramp 108 therefore relieving the racheting force.

Pawl washers could be used with the wire 41 which would be inclined such as the washers 106 shown in FIG. 11.

The spaced grooves 21, 22 in the walls 15 and 16 form supporting surfaces for the edges of printed circuit boards. First side grooves 134 shown in FIG. 2, are formed in wall 16 adjacent said side flanges 26 and 27. Second side grooves 35, as shown in FIG. 11, are formed in side wall 15 also adjacent the side flanges 26 and 27. The side panels 100 may be permanently bonded to side flanges 26 and 27 or they may be riveted to side flanges 26 and 27 or the side panels 100 may be attached to the flanges 26 and 27 by means of threaded fasteners in holes so the side panels may be disassembled and reassembled with a pair of side panels of different length to suit a new PC Board size requirement.

When the rack sections are stacked, the feet 123 of an upper rack unit may rest upon long legs 29 of a lower rack unit, below it, and the feet 123 of the lower rack may rest upon any other supporting surface such as the bottom 18 of a container. The long legs 29 are relieved at their corners at 108 so that the long leg 29 will not interfere with and will fit into a container such as container 13. The outer corners of the container at 112 may be curved inward. Thus the received portion 108 provides a clearance between the corners of the racks and the internal corner of the container.

Although not essential to the adjustability function, in practical form the threaded rods are of length to make a reasonably good fit within the length of container 13 and thus resist shifting of the load with respect to the container.

The foregoing specification sets forth the invention in its preferred, practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. A rack unit for plate like members comprising a first support wall and a second support wall disposed generally at right angles to each other,
   connecting means integrally connecting said walls together,
   a plurality of laterally spaced longitudinally extending first grooves formed in said first wall on the side adjacent said second wall,
   a plurality of laterally spaced longitudinally extending second grooves in said second wall on the side thereof adjacent said first wall,
   each said second groove being aligned with one of said first grooves whereby a side edge of a plate like member may be received in a said first groove and an end edge of said plate like member received in a said second groove,
   a first plate like leg connected to said first support wall at the end thereof remote from said second support wall and extending therefrom in a direction opposite said first wall and generally parallel to said second wall,
   a second plate like leg connected to said second support wall at the end thereof remote from said first support wall and extending therefrom in a direction opposite said second support wall and generally parallel to said first support wall,
   first foot means being integrally attached to said first leg at the end of said first leg opposite said second support wall and extending from said first leg in a direction from said second wall,
   second foot means integrally attached to said second leg at the end of said second leg opposite said first support wall and extending from said second leg in a direction from said first wall,
   said rack section being adapted to be supported on a flat surface by said foot means and said connecting means connecting said walls together,
   said first leg extending substantially further from said first support wall than said second leg extends from said second support wall providing a substantial grip space to receive the hand of an operator between said first support wall and a supporting surface on which said first foot and said recess bottom parts rest.

2. The rack unit recited in claim 1 wherein said connecting means comprises a first recess bottom part and a second recess bottom part and means integrally connecting said recess bottom parts to said supporting walls,
   said recess bottom parts being integrally connected together and offset from said first supporting wall forming a recess for receiving foreign material and to receive projections on the corners of said plate like members.

3. The rack unit recited in claim 1 wherein said connecting means comprises a first flat recess bottom part and a second flat recess bottom part integrally connected together and disposed generally at right angles to each other,
   means integrally connecting said first support wall to said first recess bottom part and means connecting said second support wall to said second support wall,
   second connecting means integrally connecting said second recess bottom part to said second support wall comprising a second inclined wall,
   said first support bottom part being disposed in substantially the same plane as said first foot and spaced therefrom,
   said second recess bottom part being disposed in the same plane as said second foot and spaced therefrom.

4. The rack unit recited in claim 1 wherein
   said grooves are defined by surfaces disposed at approximately 90° to each other,
   said grooves on said second support wall being aligned with said grooves on said first support wall whereby the side edges and end edges of said plate like parts may be received in said grooves.

5. A rack unit for plate like members comprising a first support wall and a second support wall disposed generally at right angles to each other,
   connecting means integrally connecting said walls together,
   a plurality of laterally spaced longitudinally extending first grooves formed in said first wall on the side adjacent said second wall, a plurality of laterally spaced longitudinally extending second grooves in said second wall on the side thereof adjacent said first wall, each said second groove being aligned with one of said first grooves whereby a side edge of a plate like member may be received in a said first groove and an end edge of said plate like member received in a said second groove, a first plate like leg connected to said first support wall at the end thereof remote from said second support wall and extending therefrom in a direction opposite said first wall and generally parallel to said second wall, a second plate like leg connected to said second support wall at the end thereof remote from said first support wall and extending therefrom in a direction opposite said second support wall and generally parallel to said first support wall, foot means being integrally attached to said first leg at the end of said first leg opposite said second support wall and extending from said first leg in a direction from said second wall, second foot means integrally attached to said second leg at the end of said second leg opposite said first support wall and extending from said second leg in a direction from said first wall, said rack section being adapted to be supported on a flat surface by said foot means and said connecting means connecting said walls together, a second leg, said second leg being attached to said second support wall, said first mentioned leg extends substantially further from said first mentioned support wall than said second leg extends from said second support wall providing a substantial grip space to receive the hand of an operator between said first support wall and a supporting surface on which said first foot and said recess bottom parts rest.

6. The rack unit recited in claim 3 wherein said first support wall is held at an angle of about 10° to said supporting surface by said first mentioned leg and said connecting means.

7. The rack unit recited in claim 3 wherein a first L-shaped side wall is attached at a first side of said rack unit to said first support wall, to said first foot, to said first leg, to said recess bottom means, to said second support wall, to said second leg, and to said second foot, a second L-shaped side wall is attached at a second side of said rack unit to said first foot, to said first leg, to said first support wall, to said means interconnecting said first support wall to said second support wall, to said second leg and said second foot.

8. The rack unit recited in claim 3 wherein said second means connecting said second support wall to said second bottom part comprises a third plate like member attached to said second bottom part and to said inclined wall.

9. The rack unit recited in claim 8 wherein said second support wall is approximately twice as long as said first support wall.

10. The rack unit recited in claim 9 wherein said rack unit is made of a single integral piece of reinforced plastic material.

11. In combination, a first rack unit and a second rack unit, said rack units being substantially identical, each said rack unit comprising:

a first supporting wall and a second supporting wall disposed at generally right angles to each other, means integrally connecting said supporting walls together in L-shaped relation, a laterally spaced longitudinally extending first groove formed in said first wall on the side adjacent said second supporting wall and laterally spaced longitudinally extending second grooves in said second supporting wall on the side thereof adjacent said first walls, a first plate like leg connected to said first wall at the end thereof remote from said second wall and extending therefrom in a direction opposite said second wall and generally parallel to said second wall, and means connecting said first rack unit, said second rack unit together in paired relation, said leg of said first rack unit being disposed adjacent said leg of said second rack unit.

12. The combination recited in claim 11 wherein said means connecting said supporting walls together comprises a first inclined recess bottom part and a first flat recess bottom part, means connecting said recess bottom parts together and to said support walls.

13. The combination recited in claim 12 wherein said second support walls are approximately twice as long as said first support wall.

14. The combination recited in claim 13 wherein said connecting means connecting said rack units together comprises:

a pair of spaced holes in each said first leg, each inclined wall connecting said first support wall to said first bottom having a pair of spaced holes therein and a pair of threaded rods extending through said holes, a pair of ramp members attached to said first recess bottom part, a first piece of spring wire supported on said ramp on said first bottom part and engaging the threads on said threaded rods whereby said rack units are held in adjustable spaced relation to one another.

15. The combination recited in claim 14 wherein said recess means comprises a first flat bottom part and a second flat bottom part integrally connected together at an apex, a first connecting means is provided integrally connecting said first bottom part to said first support wall, second connecting means integrally connecting said second bottom part to said second support wall, said first bottom part being disposed in a plane parallel to said first foot, said second bottom part being disposed in a plane and spaced from said second support leg.

16. The combination recited in claim 11 wherein a first L-shaped said flange is attached at a first support wall of each said rack unit and to said first foot, to said first leg, to said connecting means, to said second supporting wall, to said second leg and to said second foot, a second L-shaped side flange is attached at a second side of each said rack unit to its said first foot, said first leg, said first support wall, said second support wall.

17. The combination recited in claim 11 wherein each said rack unit has a panel support groove in its first support wall and in its second said support wall adjacent said side flanges, and said connecting means connecting said rack units together comprises two panels each having a side edge and an end edge, each said side edge being disposed in a said panel support groove in said first wall and its end edge received in said panel support grooves in said second wall.

18. The combination recited in claim 17 wherein said side panels are connected to said L-shaped side flanges whereby said rack units are restrained from moving away from each other.

19. The rack unit recited in claim 9 wherein said second leg has two spaced downwardly extending feet, one of said feet being disposed adjacent each said side flange.

20. The rack unit recited in claim 19 wherein a floor panel is disposed between said first rack unit and said second rack unit and rests on said second foot of said first rack unit and said first foot of said second rack unit.

21. The combination of a first rack unit and a second rack unit and a container, each said rack unit comprising:

a first supporting wall and a second supporting wall disposed at generally right angles to each other, connecting means integrally connecting said walls together in L-shaped relation, a laterally spaced longitudinally extending first grooves formed in said first wall on the side adjacent said second supporting wall and laterally spaced longitudinally extending second grooves in said second supporting wall on the side thereof adjacent said first walls, a first plate like leg connected to said first wall at the end thereof remote from said second wall and extending therefrom in a direction opposite said second wall and generally parallel to said second wall, second plate like leg connected to said second wall at the end thereof remote from said first wall and extending in a direction opposite said first wall and generally parallel to said first wall, foot means on said plate like legs, said second leg of said first rack unit being disposed adjacent said second leg of said second rack unit, means holding said rack units in spaced relation to each other, said rack units being received in said container, said container having two sides, two ends, and a bottom, said sides, said ends and said bottom being connected together forming an open topped container, said connecting means of each said rack unit resting on said container bottom, said foot means and said connecting means each said rack unit resting on said container bottom.

22. The combination recited in claim 21 wherein said sides and ends of said container are connected by arcuate corners, said first leg being recessed adjacent said first leg, each said first leg extending inward at its end providing a recess to fit the arcuate corners of said container.

23. The combination recited in claim 21 wherein said recessed bottom parts at said side of each said rack unit are inclined inwardly at their ends providing a relieved area to be received in a said arcuate corner of said container.

24. The combination recited in claim 23 wherein said second leg has a downwardly extending end foot part adjacent each end thereof and an intermediate foot part between said end foot parts, said intermediate foot part being disposed in a plane spaced from a plane passing through the bottom of said downwardly extending foot parts providing a clearance between said container bottom and said intermediate foot parts for an upwardly bowed bottom part of said container.

25. In combination, a first pair of identical rack units and a second pair of identical rack units, said rack units of said first pair being stacked on top of said second pair of rack units, each said rack unit comprising, a first supporting wall and a second supporting wall disposed generally at right angles to each other, connecting means integrally connecting said walls together in L-shaped relation, laterally spaced longitudinally extending first grooves formed in said first wall on the side adjacent said second supporting wall and laterally spaced longitudinally extending second grooves in said second supporting wall on the side thereof adjacent said first walls, a first plate like leg connected to said first wall at the end thereof remote from said second wall and extending therefrom in a direction opposite said second wall and generally parallel to said second wall, a second plate like leg connected to said second wall and extending therefrom in a direction opposite said first wall means supporting said second rack unit with said first leg of said first rack unit adjacent said first leg of said second rack unit, holding means holding said first rack units in predetermined spaced relation to said second rack units with said first legs adjacent each other, said first pair of said first rack units being stacked on top of said second pair of said second rack units with said connecting means of said first pair of rack units resting on said first leg of said first rack unit of said second pair.

26. The combination recited in claim 25 wherein said second leg of said second rack unit is contoured inwardly at their ends and said connecting means of said second pair of rack units are recessed at its ends to fit into said recess ends of said first legs on second rack units.

27. The combination recited in claim 26 wherein said second leg of said rack units has first foot parts adjacent its outer ends.

* * * * *